(12) United States Patent
Isik

(10) Patent No.: US 8,008,951 B2
(45) Date of Patent: Aug. 30, 2011

(54) HIGH VOLTAGE SWITCH UTILIZING LOW VOLTAGE MOS TRANSISTORS WITH HIGH VOLTAGE BREAKDOWN ISOLATION JUNCTIONS

(75) Inventor: Tacettin Isik, Saratoga, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 35 days.

(21) Appl. No.: 12/555,259

(22) Filed: Sep. 8, 2009

(65) Prior Publication Data
US 2011/0057714 A1    Mar. 10, 2011

(51) Int. Cl.
*H03K 3/00* (2006.01)
(52) U.S. Cl. ............ 327/108; 327/112; 326/83
(58) Field of Classification Search ............... 327/108, 327/112; 326/82, 83
See application file for complete search history.

(56) References Cited

U.S. PATENT DOCUMENTS

| | | | | | |
|---|---|---|---|---|---|
| 4,317,055 | A | * | 2/1982 | Yoshida et al. | 327/541 |
| 5,952,875 | A | * | 9/1999 | Yosefin et al. | 327/545 |
| 6,320,414 | B1 | * | 11/2001 | Annema et al. | 326/80 |
| 6,693,469 | B2 | * | 2/2004 | Prodanov | 327/108 |
| 7,002,372 | B2 | * | 2/2006 | Huber et al. | 326/81 |

* cited by examiner

*Primary Examiner* — Kenneth B. Wells
(74) *Attorney, Agent, or Firm* — Panitch, Schwarze, et al.

(57) ABSTRACT

A high voltage switch having first and second states includes an input receiving an input voltage that is greater than a supply voltage. Each of first, second, and third MOS structures of a first conductivity type has a gate, a source, and a drain. The sources and drains of each of the MOS structures are electrically coupled in series between the input and ground. An output is electrically coupled to the input. When the switch is in the first state, the gate of the first MOS structure is pulled to ground, the gate of the second MOS structure is pulled to the supply voltage, and the gate of the third MOS structure is pulled to a voltage greater than the supply voltage and less than the input voltage. When the switch is in the second state, the gates of all of the MOS structures are pulled to the supply voltage.

16 Claims, 6 Drawing Sheets

HIGH VOLTAGE SWITCH UTILIZING LOW VOLTAGE MOS TRANSISTORS WITH HIGH VOLTAGE BREAKDOWN ISOLATION JUNCTIONS

BACKGROUND OF THE INVENTION

An embodiment of the present invention relates generally to a high voltage switch, and more particularly, to a high voltage switch utilizing low voltage metal-oxide-semiconductor (MOS) transistors with high voltage breakdown isolation junctions.

As complementary metal-oxide-semiconductor (CMOS) technology advances, channel lengths are reduced, thereby enabling high frequency operations. While it is possible to accommodate more functionality into a smaller area, short-channel transistors present a disadvantage in that limits to the source-drain voltage restrict the ability to apply high supply voltages. This issue is particularly manifested proximate interface sections, such as input/output (I/O) pads.

FIG. 1 shows one prior art system for managing high supply voltages. A low voltage short-channel core is provided with short channel transistors having low source-drain breakdown voltages ($BV_{ds}$). A low supply voltage is either provided from the external source, or by using an internal regulator. To pass the signals from/to the core to/from the higher voltage sections, level shifters are used. Accordingly, such circuits become overly complex.

Unlike the system of FIG. 1, a second prior art system, simplified as shown in FIG. 2, does not require a combination of high and low voltage technology. However, the second system is limited only to certain types of I/Os and the input voltage cannot exceed double the supply voltage. Basically the system of FIG. 2 utilizes transistors with proper gate bias. However, the transistors are susceptible to gate oxide breakdown and the source-drain breakdown voltage $BV_{ds}$ remains limited. This can be problematic because the source/drain-to-bulk junction must sustain high voltages.

It is desirable to provide a circuit utilizing low voltage transistors for high voltage needs without an expensive and complex design that is unduly limited by the breakdown voltages of the transistors.

BRIEF SUMMARY OF THE INVENTION

Briefly stated, an embodiment of the present invention comprises a high voltage switch that has first and second states and includes an input receiving an input voltage that is greater than a supply voltage. Each of first, second, and third MOS structures of a first conductivity type has a gate, a source, and a drain. The sources and drains of each of the MOS structures are electrically coupled in series between the input and ground. An output is electrically coupled to the input. When the switch is in the first state, the gate of the first MOS structure is pulled to ground, the gate of the second MOS structure is pulled to the supply voltage, and the gate of the third MOS structure is pulled to a voltage greater than the supply voltage and less than the input voltage. When the switch is in the second state, the gates of all of the MOS structures are pulled to the supply voltage.

Another embodiment of the present invention comprises a high voltage switch that has first and second states and includes an input receiving an input voltage that is greater than a supply voltage. Each of first, second, third, and fourth MOS structures of a first conductivity type has a gate, a source, and a drain. The sources and drains of each of the MOS structures are electrically coupled in series between the input and ground. The gate of the second MOS structure is electrically coupled directly to the supply voltage. An output is electrically coupled to the input. A voltage divider is electrically coupled between the input and the supply voltage and has a first output coupled to the gate of the fourth MOS structure and a second output coupled to the gate of the third MOS structure. A reverse-biased diode is electrically coupled between the input and the voltage divider. When the switch is in the first state, the gate of the fourth MOS structure is pulled to a first voltage, the gate of the third MOS structure is pulled to a second voltage, and the gate of the first MOS structure is pulled to ground. The first gate voltage is less than the input voltage and greater than the second voltage. The second voltage is greater than the supply voltage. When the switch is in the second state, the gates of the first, third, and fourth MOS structures are pulled to the supply voltage.

Still another embodiment of the present invention comprises a high voltage switch including first, second, and third MOS structures of a first conductivity type, each having a gate, a source, and a drain. The sources and drains of each of the MOS structures are electrically coupled in series between an input and ground. When the switch is in an on state, the gates of all of the MOS structures are pulled to a supply voltage. When the switch is in an off state, the gate of the first MOS structure is pulled to ground, the gate of the second MOS structure is pulled to the supply voltage, and the gate of the third MOS structure is pulled to a voltage greater than the supply voltage and less than an input voltage received by the input. The input voltage is greater than the supply voltage. An output is electrically coupled to the input. Voltage of the output is generally equal to a total saturation voltage of the first, second, and third MOS structures when the switch is in the off state.

BRIEF DESCRIPTION OF THE DRAWINGS

The foregoing summary, as well as the following detailed description of preferred embodiments of the invention, will be better understood when read in conjunction with the appended drawings. For the purpose of illustration, there are shown in the drawings embodiments which are presently preferred. It should be understood, however, that the invention is not limited to the precise arrangements and instrumentalities shown.

FIG. 1 is a schematic block diagram of a prior art voltage processing circuit;

FIG. 2 is a schematic partial block diagram of a second prior art voltage processing circuit;

FIG. 3 is a partial cross-sectional elevational view of two isolated prior art NMOS structures;

FIG. 4 is a schematic diagram of a high voltage switch in accordance with a first preferred embodiment of the present invention;

FIG. 5 is a schematic diagram of a high voltage switch in accordance with a second preferred embodiment of the present invention; and FIG. 6 is a schematic diagram of a high voltage switch in accordance with a third preferred embodiment of the present invention.

DETAILED DESCRIPTION OF THE INVENTION

Certain terminology is used in the following description for convenience only and is not limiting. The words “right”, “left”, “lower”, and “upper” designate directions in the drawings to which reference is made. The words “inwardly” and “outwardly” refer to directions toward and away from, respectively, the geometric center of the apparatus and designated parts thereof. The terminology includes the above-listed words, derivatives thereof, and words of similar import. Additionally, the words "a" and "an", as used in the claims and in the corresponding portions of the specification, mean "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, reference to n or p can also mean either n or p or p and n can be substituted therefor.

Figure 1:
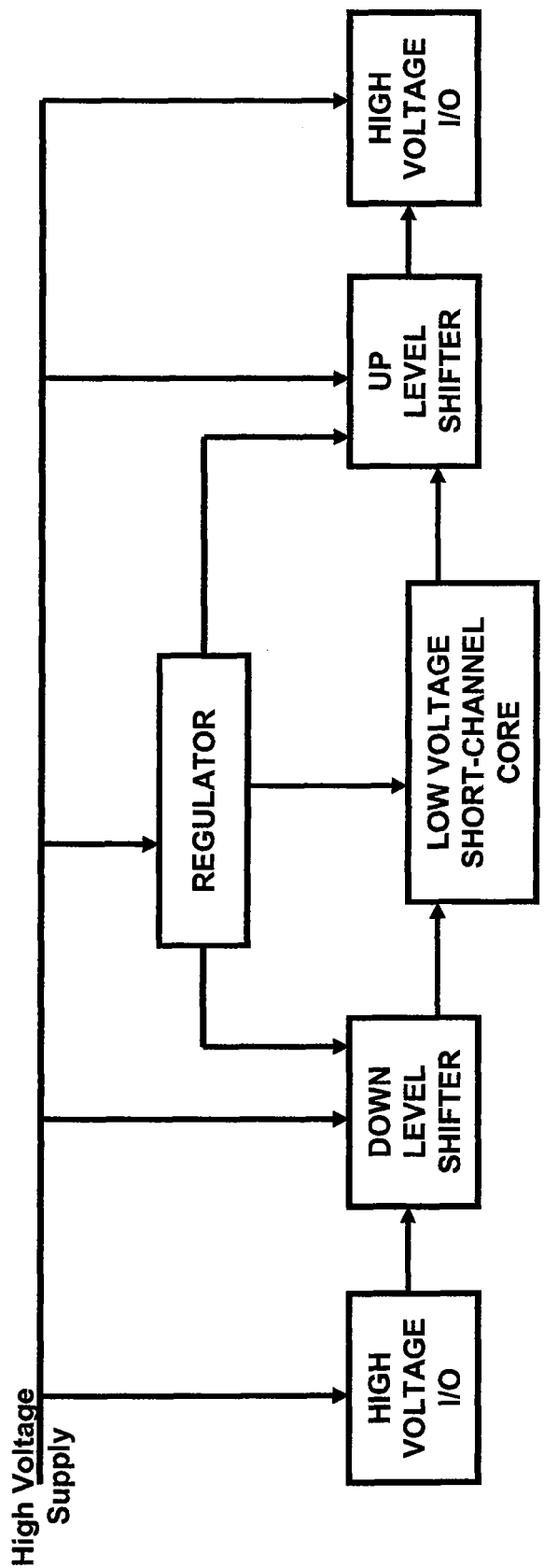
Figure 2:
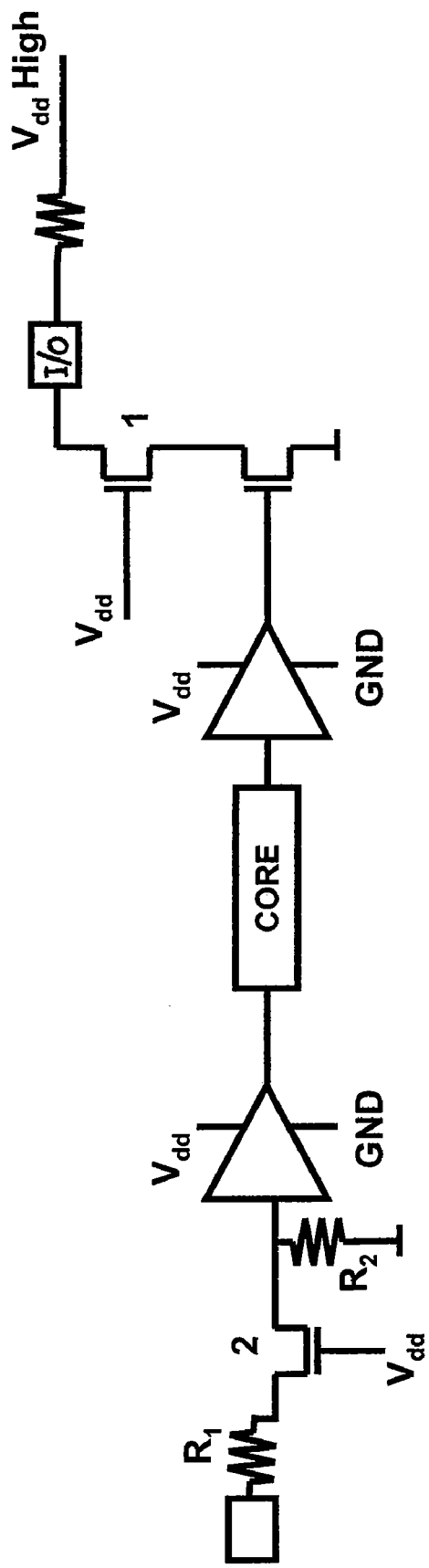
Figure 3:
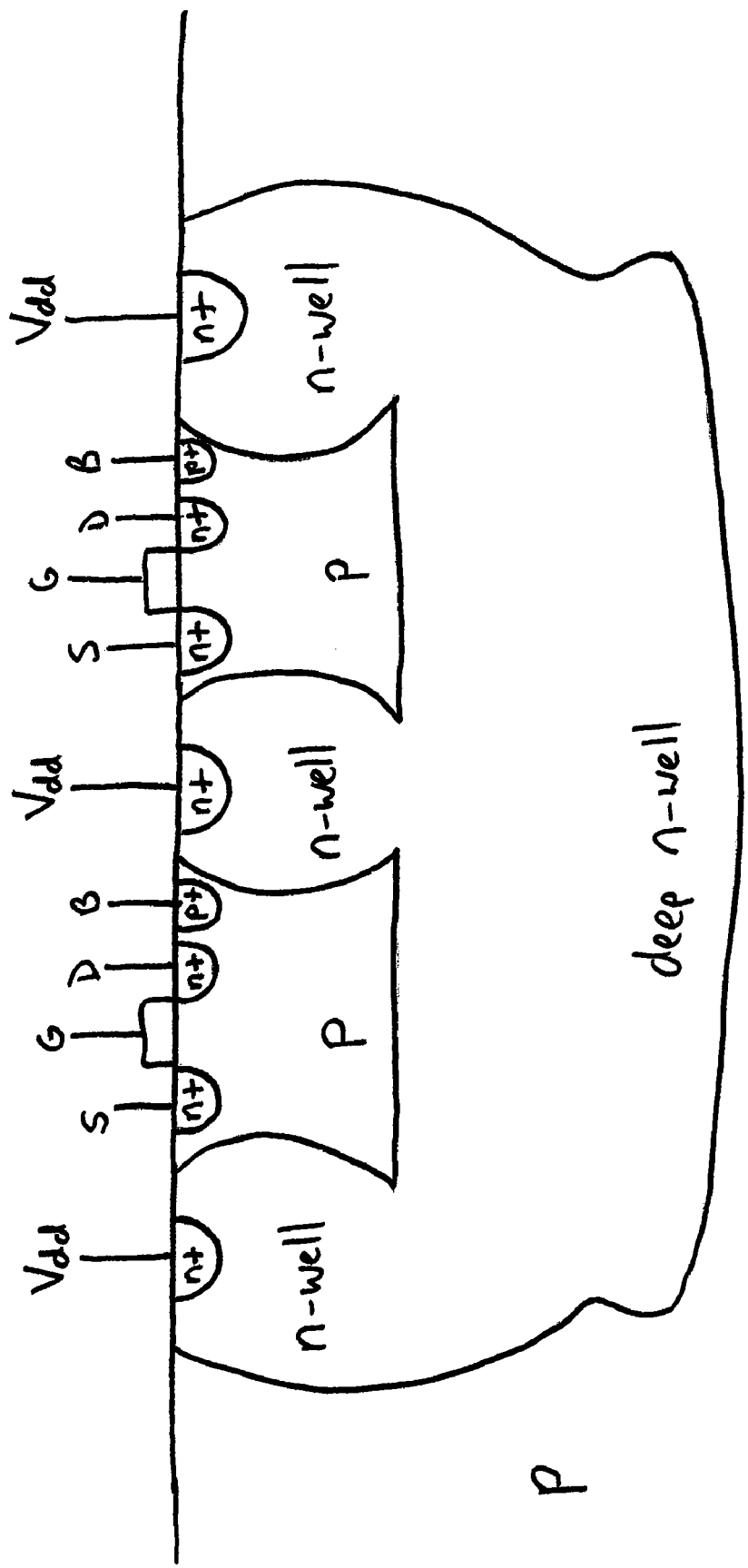

Current technology enables the isolation of transistors from one another using various techniques. One preferred technique utilizes a single crystal semiconductor-on-insulator (SOI), as shown in FIG. 3. The semiconductor layer is typically silicon. High energy dopants are implanted deep into the silicon layer to create junction isolated wells. The dopants are typically of n-type and are implanted into p-type substrates. Utilizing sidewall isolation diffusion, preferably by the n-well, completely isolated bulk areas can be created. The n-type diffusions must be tied to the highest voltage. However, the bulk regions can be set to any lower voltage, even a negative voltage. Thus, the transistors need not sustain the highest voltages provided the topology is arranged properly.

Figure 4:
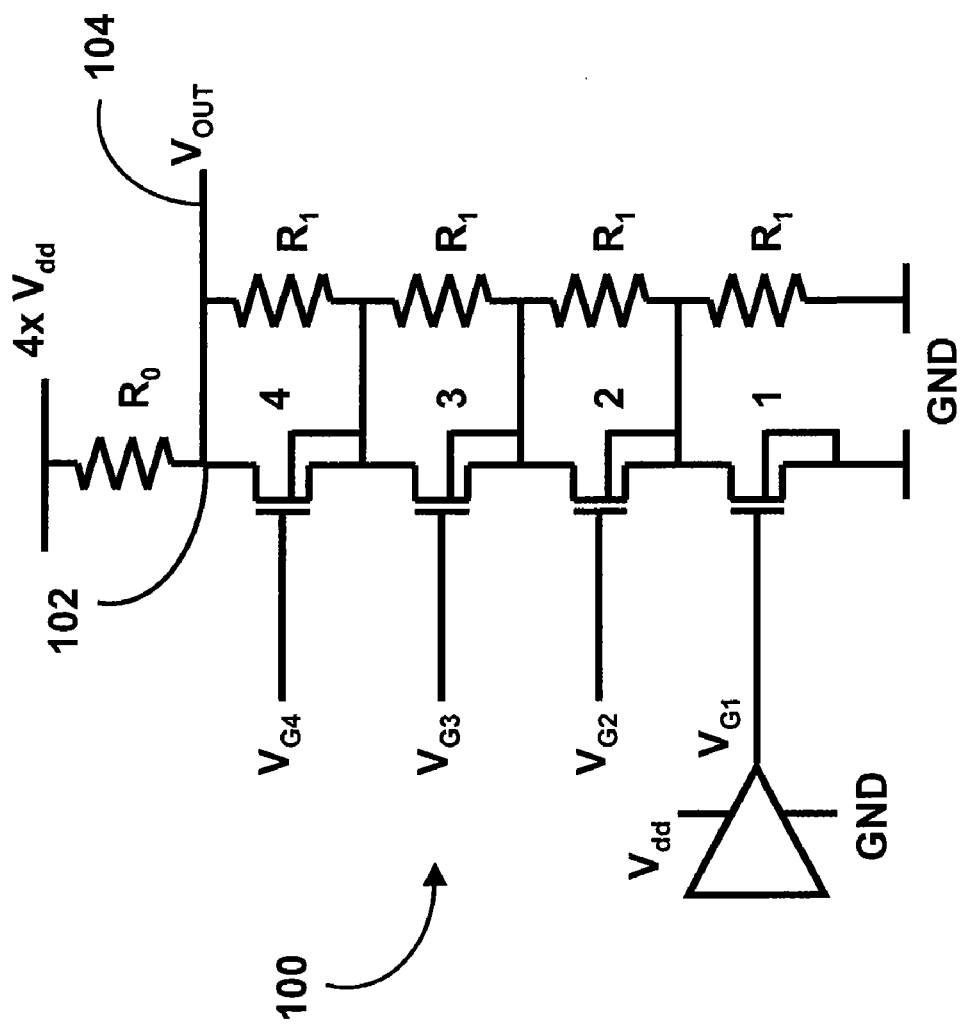

Embodiments of the present invention are directed to a topology of devices, such as the device shown in FIG. 3, for use in handling voltages exceeding double a supply voltage $V_{dd}$. FIG. 4 shows a first preferred embodiment of a high voltage switch 100 in accordance with a first preferred embodiment. A resistive load $R_0$ is shown supplied by a voltage source at a multiple of the circuit supply voltage $V_{dd}$ and coupled to an input 102 of the switch 100. For exemplary purposes, the voltage source is set at four times the supply voltage $V_{dd}$, but may be any other multiple wherein the voltage source is greater than the supply voltage $V_{dd}$. Further, for simplicity, the resistive load $R_0$ is illustrated as a resistor, but may be some other load and is preferably an inductor for certain applications, such as for boost DC/DC converters or the like. An output 104 is also electrically coupled to the input 102 and receives an output voltage $V_{OUT}$.

The switch 100 includes a number of semiconductor MOS structures (preferably transistors) of a first conductivity type (preferably n-type), each having a gate, a source, a drain, and a bulk connection. The sources and drains of the MOS structures are electrically coupled in series between the input 102 and ground GND. FIG. 4 shows the switch 100 having four NMOS structures 1, 2, 3, 4, but any number, subject to limitations of junction breakdowns, may be provided. The breakdown voltages between the gate and the bulk region $BV_{GB}$, the gate and the source $BV_{GS}$, the gate and the drain $BV_{GD}$, and the drain and the source $BV_{DS}$ are each preferably at least slightly higher than the supply voltage $V_{dd}$ to provide a safety margin. However, the junction breakdown of isolated and global bulk to the n-well or deep n-well junctions is greater than the source voltage (e.g., $4 \times V_{dd}$ in FIG. 4). The resistance of the load $R_0$ is also preferably large enough such that the sum of all drain-source saturation voltages $V_{DSSAT}$ of the MOS structures 1, 2, 3, 4 is less than the supply voltage $V_{dd}$.

The gates of the MOS structures 1, 2, 3, 4 are each pulled to a particular respective gate voltage $V_{G1}$, $V_{G2}$, $V_{G3}$, $V_{G4}$. The switch 100 preferably includes two states. In the first state, the gate of the lowest (closest to ground GND) MOS structure 1 is pulled to ground GND, the gate of the second lowest MOS structure 2 is pulled to the supply voltage $V_{dd}$, and the gates of the rest of the MOS structures are pulled to respectively higher voltages that are greater than the supply voltage $V_{dd}$ but less than the voltage at the input 102 so that all of the MOS structures 1, 2, 3, 4 are "off." Specifically in FIG. 4, $V_{G1}=0$. $V_{G2}=V_{dd}$, $V_{G3}=2 \times V_{dd}$, and $V_{G4}=3 \times V_{dd}$. The output voltage $V_{OUT}$ is consequently approximately equal to the voltage at the input 102 (e.g., approximately $4 \times V_{dd}$ in FIG. 4). In the second state, the gates of all of the MOS structures 1, 2, 3, 4 are pulled to the supply voltage $V_{dd}$ so that all of the MOS structures 1, 2, 3, 4 are "on." As a result, the output voltage $V_{OUT}$ is equal to the total saturation voltage $V_{SATTOT}$ of the MOS structures 1, 2, 3, 4, and there is no problem of exceeding the gate-related breakdown voltages $BV_{GX}$.

The MOS structures 1, 2, 3, 4 are preferably identical. However, to compensate for possible mismatches or for optimum sizing, biasing resistors $R_1$ are connected in parallel with each of the respective MOS structures 1, 2, 3, 4. The biasing resistors $R_1$ preferably each have much higher resistances than the load $R_0$ such that, for example in FIG. 4, the output voltage VOUT is approximately equal to $4 \times V_{dd}$, the voltage between the third and fourth MOS structures 3, 4 is approximately equal to $3 \times V_{dd}$, the voltage between the second and third MOS structures 2, 3 is approximately equal to $2 \times V_{dd}$, and the voltage between the first and second MOS structures 1, 2 is approximately equal to $V_{dd}$.

It is seen that in both the first and second states, the gate voltage $V_{G2}$ is equal to the supply voltage $V_{dd}$. Thus, the gate of the second MOS structure 2 may be electrically coupled directly to the supply voltage $V_{dd}$, as shown in FIG. 5.

Figure 5:
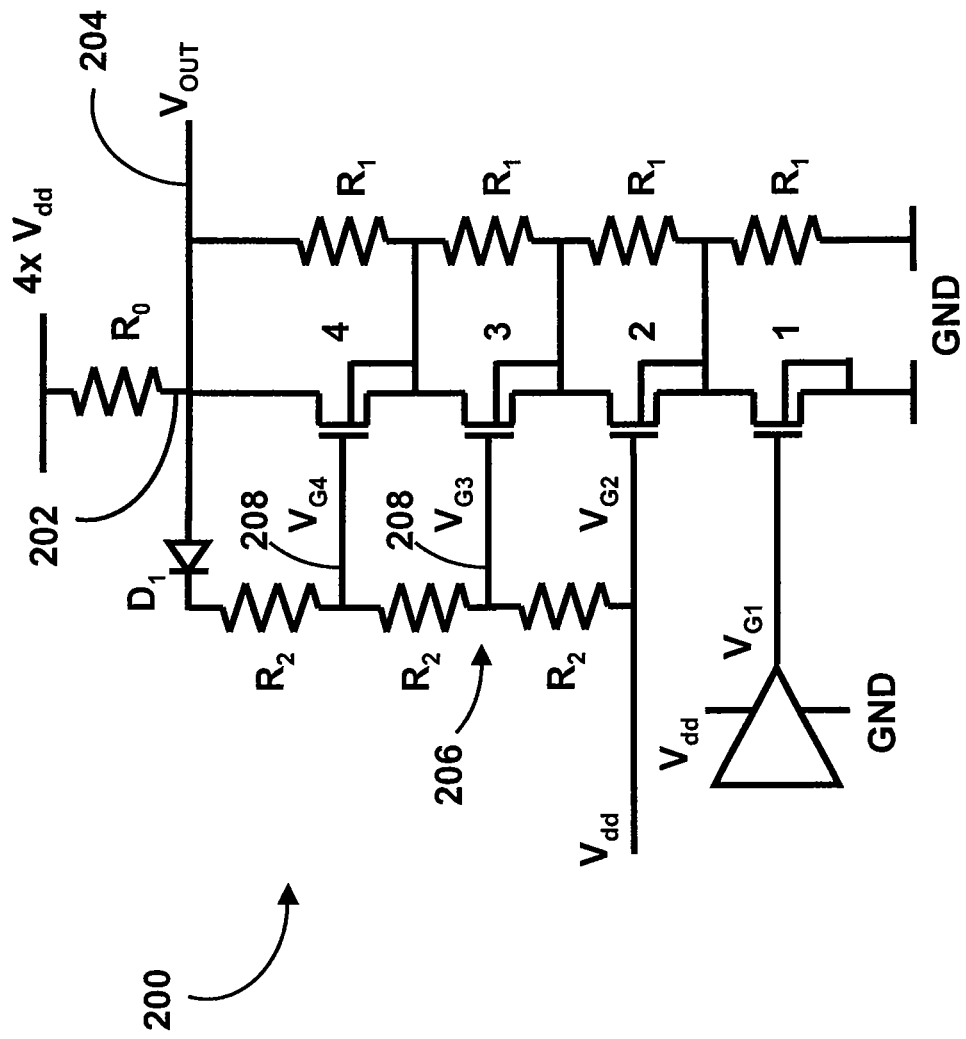

FIG. 5 shows a second embodiment of a switch 200 similar to switch 100 of FIG. 4, but having a voltage divider 206 coupled between the input 202 and the supply voltage $V_{dd}$. Outputs 208 of the voltage divider 206 are applied to the gates of all MOS structures above the second MOS structure 2 having the gate coupled to the supply voltage $V_{dd}$. A reverse-biased diode D1 is preferably electrically coupled between the input 202 and the voltage divider 206.

The voltage divider 206 shown in FIG. 5 is a resistive type, utilizing a plurality of resistors $R_2$, but may also be a capacitive or other type voltage divider. Like the biasing resistors $R_1$, the divider resistors $R_2$ preferably each have much larger resistances than the load $R_0$. As a result, in the example of FIG. 5 (neglecting the voltage drop across the diode D1) when the switch 200 is in the first state, the output voltage $V_{OUT}$ is approximately equal to $4 \times V_{dd}$, and the respective gate voltages are set as follows $V_{G4} \approx 3 \times V_{dd}$, $V_{G3} \approx 2 \times V_{dd}$, $V_{G2}=V_{dd}$, and $V_{G1}=0$, ensuring that all of the MOS structures 1, 2, 3, 4 are "off."

When the first MOS structure 1 is turned "on," the voltage across the MOS structure 1 becomes the saturation voltage $V_{DSSAT1}$ of the first MOS structure 1, and the voltage between the source and gate of the second MOS structure 2 is sufficient to turn the second MOS structure "on." The chain reaction continues up to the final MOS structure 4 such that the output voltage $V_{OUT}$ becomes the total saturation voltage $V_{SATTOT}$, which as described above is much less than the supply voltage $V_{dd}$. With the diode D1 being reverse biased, all of the gate voltages $V_{G1}$, $V_{G2}$, $V_{G3}$, and $V_{G4}$ are pulled to the supply voltage $V_{dd}$ and the switch 200 is in the second state with all of the MOS structures 1, 2, 3, 4 being "on."

Figure 6:
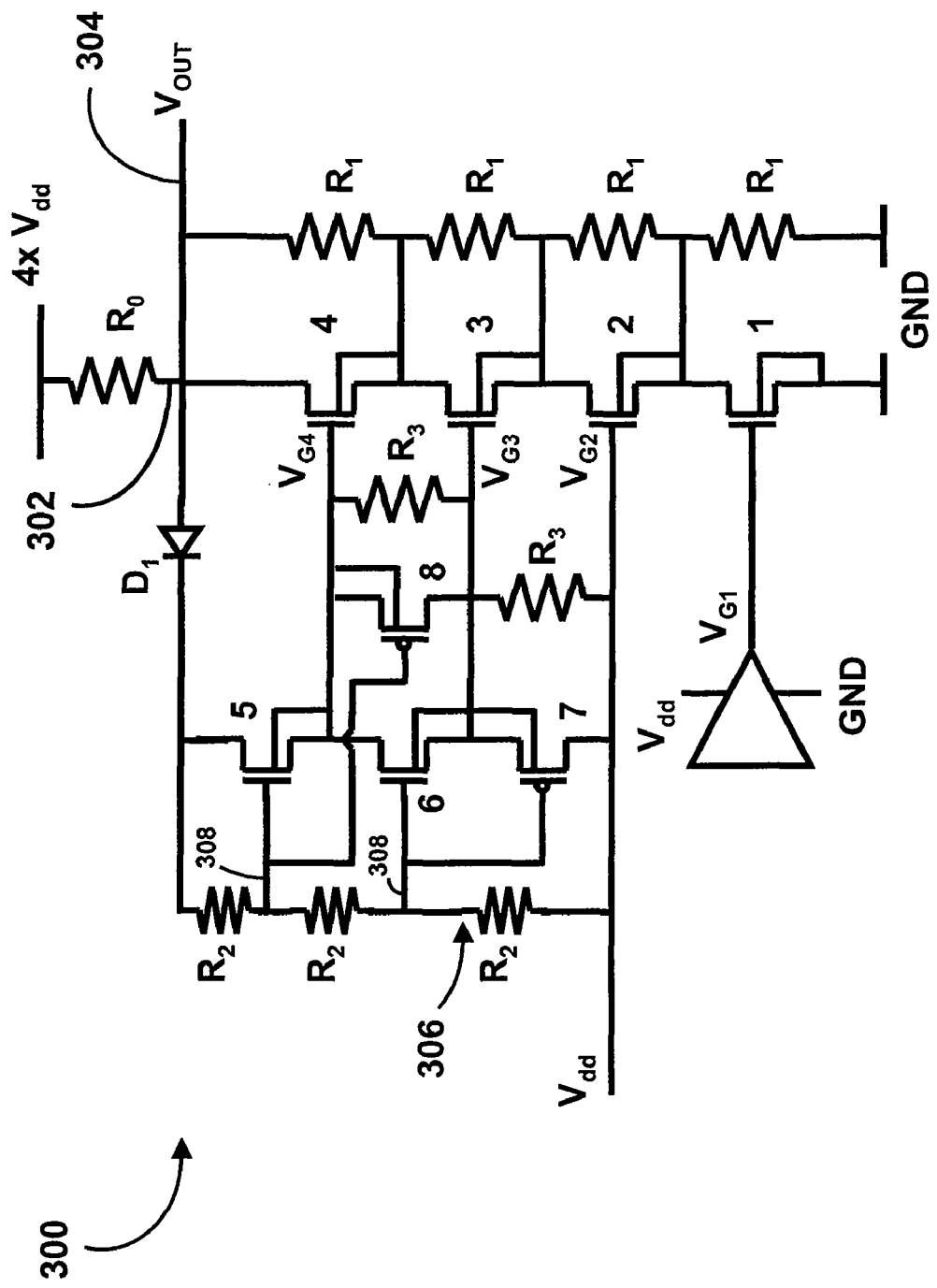

When the divider resistors $R_2$ are relatively large, the switch 200 may experience a lag due to capacitance at the gates preventing rapid transition between states. To compensate, FIG. 6 shows a third embodiment of the switch 300 similar to the switch 200 of FIG. 5, but providing for low drive resistance.

Source follower MOS structures are preferably utilized for driving the gates of MOS structures above the second MOS structure 2 having its gate coupled directly to the supply voltage $V_{dd}$. For example, a first source follower MOS structure 5 is used to drive the gate of the fourth MOS structure 4, and a second source follower MOS structure 6 is used to drive the gate of the third MOS structure 3. The source follower MOS structures 5, 6 are preferably of the first conductivity type (preferably n-type), each having a gate, a source, a drain, and a bulk connection. Gates of the source follower MOS structures 5, 6 are electrically coupled to respective outputs 308 of the voltage divider 306. The source and drain of the first source follower MOS structure 5 are electrically coupled between the input 302 and the gate of the fourth MOS structure 4, and the source and drain of the second source follower structure are electrically coupled between the respective gates of the third and fourth MOS structures 3, 4. It is thus seen that the first source follower MOS structure 5 and the fourth MOS structure 4 (as well as the second source follower MOS structure 6 and the third MOS structure 3) are configured much like a Darlington pair. As a result, an increase in gain is obtained such that only a small current is required to switch "on" the respective pair, thus reducing delay caused by the divider resistors $R_2$.

Discharge MOS structures are also preferably utilized with respective source follower MOS structures. For example, first discharge and second discharge MOS structures 7, 8 are preferably of a second conductivity type opposite to the first conductivity type (preferably p-type), each having a gate, a source, a drain, and a bulk connection. Gates of the discharge MOS structures 7, 8 are electrically coupled to respective outputs 308 of the voltage divider 306. The source and drain of the first discharge MOS structure 7 are electrically coupled between the respective gates of the third and fourth MOS structures 3, 4. The source and drain of the second discharge MOS structure 8 are electrically coupled between the gate of the third MOS structure 3 and the supply voltage $V_{dd}$. Additional resistors $R_3$ may be added to the switch 300 in parallel with each of the discharge MOS structures 7, 8 to prevent gate nodes from leaking high. The discharge MOS structures 7, 8 speed up the gate discharge through the additional resistors $R_3$ by clamping the gate voltages $V_{G3}$, $V_{G4}$ to be higher than the respective divider resistor R2 node by the gate voltage of the respective discharge MOS structure 7, 8.

From the foregoing, it can be seen that none of the gate oxides of the MOS structures 1, 2, 3, 4 experiences a voltage higher than the supply voltage $V_{dd}$, while an output swing may be between the total saturation voltage $V_{DSSATTOT}$ and the source voltage (e.g., $4 \times V_{dd}$).

The foregoing examples described and showed the MOS structures 1, 2, 3, 4, as NMOS transistors, but it is understood by those skilled in the art that a similar arrangement may be configured using PMOS transistors.

It will be appreciated by those skilled in the art that changes could be made to the embodiments described above without departing from the broad inventive concept thereof. It is understood, therefore, that the invention is not limited to the particular embodiments disclosed, but it is intended to cover modifications within the spirit and scope of the present invention as defined by the appended claims.

I claim:

1. A high voltage switch having first and second states comprising:
   (a) an input receiving an input voltage that is greater than a supply voltage;
   (b) first, second, and third metal oxide semiconductor (MOS) structures of a first conductivity type, each having a gate, a source, and a drain, the sources and drains of each of the MOS structures being electrically coupled in series between the input and ground;
   (c) an output electrically coupled to the input;
   (d) at least one additional MOS structure of the first conductivity type and having a gate, a source, and a drain, the source and drain of the at least one additional MOS structure being coupled in series between the second and third MOS structures, whereby:
   when the switch is in the first state, the gate of the first MOS structure is pulled to ground, the gate of the second MOS structure is pulled to the supply voltage, the gate of the third MOS structure is pulled to a voltage greater than the supply voltage and less than the input voltage, and the gate of the at least one additional MOS structure is pulled to a voltage greater than the voltage of the gate of the second MOS structure and less than the voltage of the gate of the third MOS structures, and
   when the switch is in the second state, the gates of all of the MOS structures are pulled to the supply voltage.

2. The switch of claim 1, wherein the gate of the second MOS structure is electrically coupled directly to the supply voltage.

3. The switch of claim 1, wherein the first conductivity type is one of n-type and p-type.

4. The switch of claim 1, wherein the voltage of the output is generally equal to the input voltage when the switch is in the first state.

5. The switch of claim 1, wherein voltage of the output is generally equal to a total saturation voltage of the first, second, third, and at least one additional MOS structures when the switch is in the second state.

6. The switch of claim 1, wherein breakdown voltages of each of the first, second, third, and at least one additional MOS structures are greater than the supply voltage.

7. A high voltage switch having first and second states comprising:
   (a) an input receiving an input voltage that is greater than a supply voltage;
   (b) first, second, and third metal oxide semiconductor (MOS) structures of a first conductivity type, each having a gate, a source, and a drain, the sources and drains of each of the MOS structures being electrically coupled in series between the input and ground, the gate of the second MOS structure being directly coupled to the supply voltage;
   (c) an output electrically coupled to the input; and
   (d) a voltage divider electrically coupled between the input and the supply voltage and having an output coupled to the gate of the third MOS structure, whereby:
   when the switch is in the first state, the gate of the first MOS structure is pulled to ground, the gate of the second MOS structure is pulled to the supply voltage, and the gate of the third MOS structure is pulled to a voltage greater than the supply voltage and less than the input voltage, and
   when the switch is in the second state, the gates of all of the MOS structures are pulled to the supply voltage.

8. The switch of claim 7, further comprising:
   (e) a source follower MOS structure of the first conductivity type having a gate, a source, and a drain, the gate of the source follower MOS structure being electrically coupled to the output of the voltage divider, the source and drain of the source follower MOS structure being electrically coupled between the input and the gate of the third MOS structure.

9. The switch of claim 8, further comprising:
(f) a discharge MOS structure of a second conductivity type having a gate, a source, and a drain, the gate of the discharge MOS structure being electrically coupled to the output of the voltage divider, the source and drain of the discharge MOS structure being electrically coupled in series between the gate of the third MOS structure and the supply voltage, the second conductivity type being opposite to the first conductivity type.

10. The switch of claim 7, further comprising:
(e) a reverse-biased diode electrically coupled between the input and the voltage divider.

11. The switch of claim 7, wherein the voltage divider is one of a resistive voltage divider and a capacitive voltage divider.

12. The switch of claim 7, wherein the voltage of the output is generally equal to the input voltage when the switch is in the first state.

13. The switch of claim 7, wherein voltage of the output is generally equal to a total saturation voltage of the first, second, and third MOS structures when the switch is in the second state.

14. The switch of claim 7, wherein breakdown voltages of each of the first, second, and third MOS structures are greater than the supply voltage.

15. A high voltage switch having first and second states comprising:
(a) an input receiving an input voltage that is greater than a supply voltage;
(b) first, second, third, and fourth metal oxide semiconductor (MOS) structures of a first conductivity type, each having a gate, a source, and a drain, the sources and drains of each of the MOS structures being electrically coupled in series between the input and ground, the gate of the second MOS structure being electrically coupled directly to the supply voltage;
(c) an output electrically coupled to the input;
(d) a voltage divider electrically coupled between the input and the supply voltage and having a first output coupled to the gate of the fourth MOS structure and a second output coupled to the gate of the third MOS structure; and
(e) a reverse-biased diode electrically coupled between the input and the voltage divider, whereby:
when the switch is in the first state, the gate of the fourth MOS structure is pulled to a first voltage, the gate of the third MOS structure is pulled to a second voltage, and the gate of the first MOS structure is pulled to ground, the first voltage being less than the input voltage and greater than the second voltage, the second voltage being greater than the supply voltage, and
when the switch is in the second state, the gates of the first, third, and fourth MOS structures are pulled to the supply voltage.

16. The switch of claim 15, further comprising:
(f) first and second source follower MOS structures of the first conductivity type, each having a gate, a source, and a drain, the gate of the first source follower MOS structure being electrically coupled to the first output of the voltage divider, the source and drain of the first source follower MOS structure being electrically coupled between the input and the gate of the fourth MOS structure, the gate of the second source follower MOS structure being electrically coupled to the second output of the voltage divider, the source and drain of the second source follower MOS structure being electrically coupled between the gate of the fourth MOS structure and the gate of the third MOS structure; and
(g) first and second discharge MOS structures of a second conductivity type, each having a gate, a source, and a drain, the gate of the first discharge MOS structure being electrically coupled to the first output of the voltage divider, the source and drain of the first discharge MOS structure being electrically coupled between the gate of the fourth MOS structure and the gate of the third MOS structure, the gate of the second discharge MOS structure being electrically coupled to the second output of the voltage divider, the source and drain of the first discharge MOS structure being electrically coupled between the gate of the third MOS structure and the supply voltage, the second conductivity type being opposite to the first conductivity type.

* * * * *